(12) United States Patent
Yamaguchi et al.

(10) Patent No.: US 6,878,241 B2
(45) Date of Patent: Apr. 12, 2005

(54) METHOD OF FORMING DEPOSITED FILM (75) Inventors: Hirohito Yamaguchi, Kanagawa (JP); Masahiro Kanai, Tokyo (JP); Atsushi Koike, Kanagawa (JP); Katsunori Oya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 10/409,190

(22) Filed: Apr. 9, 2003

(65) Prior Publication Data

US 2003/0192778 A1 Oct. 16, 2003

(30) Foreign Application Priority Data

Apr. 16, 2002 (JP) ........................................ 2002-113345

(51) Int. Cl.⁷ ............................................. C23C 14/35
(52) U.S. Cl. ............................. 204/192.12; 204/298.16
(58) Field of Search ........................ 204/192.12, 298.16

(56) References Cited

U.S. PATENT DOCUMENTS

| | | | |
|---|---|---|---|
| 4,971,674 A | 11/1990 | Hata ..................... 204/192.12 |
| 5,160,388 A | * 11/1992 | Legresy et al. ............. 148/552 |
| 5,178,739 A | * 1/1993 | Barnes et al. .......... 204/192.12 |
| 5,234,561 A | * 8/1993 | Randhawa et al. .... 204/192.38 |
| 6,551,471 B1 | 4/2003 | Yamaguchi et al. ... 204/192.12 |
| 2002/0006477 A1 | 1/2002 | Shishido et al. ............ 427/569 |
| 2003/0000475 A1 | * 1/2003 | Voutsas et al. ............. 118/715 |
| 2003/0143868 A1 | 7/2003 | Yamaguchi et al. ........ 438/788 |
| 2003/0190412 A1 | 10/2003 | Koike et al. ................ 427/180 |

FOREIGN PATENT DOCUMENTS

JP          7-9061       2/1995       ............ B21J/15/44

* cited by examiner

Primary Examiner—Steven Versteeg
(74) Attorney, Agent, or Firm—Fitzpatrick, Cella, Harper & Scinto (57) ABSTRACT Sputtering particles emitted from a target are ionized by the Penning ionization process. And the sputtering particles ionized are caused to fly in the direction of the substrate by a magnetic field formed by ambipolar diffusion due to a magnetic field generating means without scattering the particles to deposit the particles on the substrate. The partial pressure of a sputtering discharge gas in a discharge space is set to 1.3 Pa or less and a distance from the target to an ionization space is within twice the mean free path of the partial pressure of the sputtering discharge gas.

7 Claims, 3 Drawing Sheets

METHOD OF FORMING DEPOSITED FILM

BACKGROUND OF THE INVENTION

1. Field of the Invention

The present invention relates to a deposited-film forming method of forming a thin film composed of an alloy on a substrate by use of an alloy target (a sputtering method) and, more particularly, to a method of forming a deposited film on a substrate by ionizing sputtering particles (an ionized sputtering method).

2. Related Background Art

In various types of semiconductor devices, alloy thin films are used as wiring layers and heater layers. As methods of forming such alloy thin films, there are available the resistive heating deposition method, the electron beam (EM) deposition method, the sputtering method, etc. Among others, the sputtering method that is favorable in terms of controllability and mass production is frequently used. Apparatuses for forming an alloy thin film using the sputtering method have problems such as the fact that the composition of an alloy thin film is apt to differ from the composition of an alloy target, and in order to solve such problems various measures have been required.

There is a multitarget simultaneous sputtering method as one of the conventional sputtering methods by which an alloy thin film is formed. In the multitarget simultaneous sputtering method, one target is provided for each metallic element of an alloy thin film, a sputtering power source is connected to each target, and a thin film is formed by simultaneously discharging electricity. Because in this multitarget simultaneous sputtering method input power can be adjusted for each target and besides the film forming rate is variable, it is possible to form an alloy thin film of an arbitrary composition and even during film forming the composition of an alloy thin film can be easily adjusted.

However, in carrying out this multitarget simultaneous sputtering method, it is necessary to use targets in the same number as the number of types of elements of the alloy thin film and accordingly it is necessary to increase the sizes of the target unit, sputtering power source and film forming chamber, posing the problem that the equipment cost increases substantially. Furthermore, in the multitarget simultaneous sputtering method, because of use of a plurality of targets, running costs also increase. Therefore, this method is not adopted as a mass production technique and is used mainly as an experimental technique.

There is an alloy sputtering method as another sputtering method of forming an alloy thin film. In the alloy sputtering method, one alloy target composed of the same elements as those of the alloy thin film is used. In this alloy sputtering method, it is possible to form an alloy thin film by use of one target and equipment cost and running costs are low. Therefore, this method is favorably used as a mass production technique.

However, in this alloy sputtering method, sputtering particles sputtered from the target collide against a sputtering discharge gas and sputtering discharge gas ions to scatter before becoming incident upon the substrate, whereby the composition of an alloy thin film deposited on the substrate differs from the composition of the target. More specifically, the scattering condition of sputtering particles differs in kinds of elements; among the elements constituting the target, the lighter the weight of an element, the greater the extent of scattering, and when an element is heavy, then the element will become less apt to scatter in proportion. Therefore, although the composition of sputtering particles has the same composition as that of the alloy target immediately when they sputter from the target, the composition of the alloy thin film finally deposited on the substrate is such that compared with the alloy target, light elements become small in its content and heavy elements become large in its content.

Furthermore, under the alloy sputtering method, also in a case where pressure is changed in order to change the film quality of an alloy film or in a case where the flow rate ratio of a sputtering discharge gas to a reactive gas is changed in reactive sputtering, the scattering condition of sputtering particle changes, thereby posing the problem that the composition of the alloy thin film changes. For this reason, in the alloy sputtering method, it is necessary to prepare beforehand a plurality of targets having different compositions and to create the conditions for obtaining an alloy thin film of the desired composition by forming an alloy thin film for each target. This creation of conditions required much time. Furthermore, in the alloy sputtering method, similarly much time was required also in changing film quality.

On the other hand, in Japanese Patent Publication No. 7-9061 discloses the plasma control magnetron sputtering method as a further sputtering method of forming an alloy thin film. In this plasma control magnetron sputtering method, first, a target of one element of the elements forming an alloy thin film is used as a base target and other element materials are arranged as small pieces in a plurality of regions on the base target. And a plasma is caused to move in the direction of radiation of the target by changing the value of a current flowing through a solenoid coil disposed in the peripheral portion of the target and changing the magnetic field distribution on the target surface, and an alloy thin film is deposited by causing sputtering while adjusting the composition.

However, the plasma control magnetron sputtering method has the following problems:

In order to form an alloy thin film of the desired composition, much time is required in creating conditions, such as the setting of the areas of the small-piece targets and the values of a current caused to flow through the solenoid coil.

In order to form an alloy thin film of the desired composition, it is necessary to continuously adjust the values of a current caused to flow through the solenoid coil until the target is completely consumed.

When for some reason the small-piece chips have moved, the composition of an alloy thin film changes.

In view of the foregoing, it was difficult to adopt the plasma control magnetron sputtering method as a mass production technique.

As described above, the conventional methods of forming a deposited film had the following respective problems:

(1) In the multitarget simultaneous sputtering method, it is necessary to use targets in the same number as the number of types of elements of the alloy thin film. The sizes of a target unit, a sputtering power source and a film-forming chamber are increased. Therefore, the equipment cost is high.

(2) In the alloy sputtering method, the scattering condition of sputtering particles differs in the kinds of the elements. Among the elements constituting the target, the lighter the weight of an element, the greater the extent of scattering and if an element is heavy, then the element will become less apt to scatter in proportion. Therefore, although the composition of sputtering particles has the same composition as that of the alloy target immediately when the particles sputter from the target, the composition of the alloy thin film deposited on the substrate has a smaller number of light elements and a large number of heavy elements, compared with the alloy target, whereby the composition of the alloy thin film becomes different from the desired composition. Therefore, in order to form an alloy thin film of the desired composition, it becomes necessary to create conditions beforehand by use of a plurality of targets having different compositions and the creation of conditions required much time. Furthermore, similarly much time was required also in changing film quality.

(3) In the plasma control magnetron sputtering method, much time is required to create conditions necessary for forming an alloy thin film of the desired composition, such as the setting of the areas of the small-piece targets and the values of a current caused to flow through the solenoid coil, it is necessary to continuously adjust the values of a current caused to flow through the solenoid coil until the target is completely consumed in order to form an alloy thin film of the desired composition, and the composition of an alloy thin film changes when for some reason the small-piece chips have moved.

SUMMARY OF THE INVENTION

An object of the present invention is to provide a deposited-film forming method of forming on a substrate a thin film composed of an alloy having the same composition (the change rate of the composition is within 3%) as that of an alloy target without changing film forming conditions from the start of the use of the target until the target is completely consumed.

A deposited-film forming method of forming a thin film composed of an alloy on a substrate by performing sputtering by use of an alloy target according to the present invention, comprises: the first step of performing the Penning ionization of sputtering particles sputtered from the alloy target; and the second step of causing the ionized sputtering particles to fly in the direction of the substrate by the ambipolar diffusion action due to a magnetic field formed from an ionization space to the substrate.

DETAILED DESCRIPTION OF THE PREFERRED EMBODIMENTS

Figure 1:
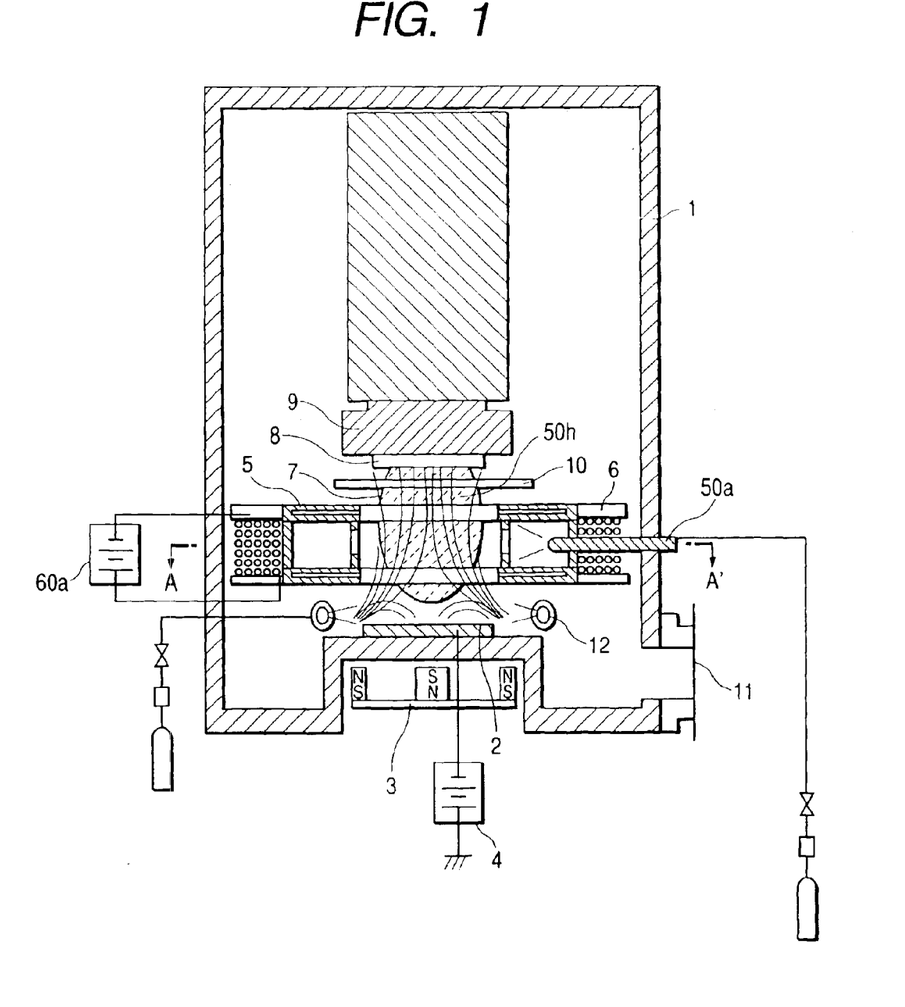
FIG. 1 is a sectional view showing the structure of an ionization sputtering apparatus to which a method of forming a deposited film in an embodiment of the present invention is applied.

Next, a method of forming a deposited film in an embodiment of the invention will be described in detail below by referring to the drawings. FIG. 1 is a sectional view showing the structure of an ionization sputtering apparatus to which a method of forming a deposited film in an embodiment of the present invention is applied. FIG. 1 is a side sectional view of this ionization sputtering apparatus. As shown in FIG. 1, this ionization sputtering apparatus is provided with an ionization mechanism 5 of the hot cathode type. In the method of forming a deposited film according to the present invention, i.e., the ionization sputtering method, sputtering particles sputtered from a target 2 are ionized by the Penning ionization method (the first step), and the ionized sputtering particles are caused to fly in the direction of a substrate 8 by the ambipolar diffusion action due to a magnetic field 7 generated by magnetic field generating means 6 (the second step) and are deposited on the substrate 8.

A chamber 1 which is a metal vessel made of stainless steel, aluminum, etc., is electrically grounded and configured so as to keep airtightness by use of a gate valve not shown in the drawing. The volume of the chamber 1, which is determined according to the sizes of the target 2 and substrate 8, is about 20 to 1000 liters with the exception of special cases.

A combined exhaust system 11 is a combined exhaust system capable of reducing an internal pressure of the chamber 1 from atmospheric pressure to about $1\times10^{-5}$ Pa and can control exhaust speed by use of a conductance valve (not shown) which is an exhaust speed regulator.

The target 2 has a disk shape, for example, about 3 mm in thickness and about 3 inches (76.2 mm) in diameter and is provided within the chamber 1 through a backing plate and an insulator. Behind the target 2 is provided a magnet mechanism 3 for magnetron sputtering discharge so that magnetron sputtering can be carried out by operating this mechanism.

A sputtering power source 4 is used to apply a predetermined power to the target 2 and is so configured that a negative voltage of 200 to 600 (V) is applied by use of a DC power source or a high frequency power source such as an RF power source.

Immediately above the target 2 is provided gas introducing means 12 for a sputtering discharge gas. A structure of such a construction that a large number of gas blow holes are formed in the center side surface of a ring pipe is used as the gas introducing means 12 for sputtering discharge. In this configuration, the gas introduced to the target surface can be made uniform without unevenness. Rare gases having high sputtering rates in an ionized state, such as argon (Ar), krypton (Kr) and xenon (Xe), are used as a gas introduced from the gas introducing means 12 for sputtering discharge.

What is important for the introduction of a sputtering discharge gas in this embodiment is that the partial pressure of the sputtering discharge gas in the discharge space is set within a predetermined range, preferably, at 1.3 Pa or less. The value of 1.3 Pa was a value experimentally determined, the grounds for the determination of this value will be described below.

The composition of sputtering particles has the same composition as that of the alloy target just at the time of emission of the particles by sputtering from the target. However, the sputtering particles collide against a sputtering discharge gas or sputtering discharge gas ions to scatter before reaching the substrate, whereby the composition of an alloy thin film deposited on the substrate differs from the composition of the target. For this reason, in the method of forming a deposited film according to this embodiment, the sputtering particles sputtered from the target are instantaneously ionized immediately above the target 2 and scattering is prevented by controlling the flying paths of the ionized sputtering particles through the utilization of the ambipolar diffusion action by a magnetic field, whereby an alloy thin film having the same composition as that of the alloy target is deposited on the substrate.

Therefore, because it is necessary to prevent the sputtering particles from being scattered also between the target 2 and the ionization space 50h, it is preferred that the distance from the target 2 to the ionization space 50h be reduced to a minimum. However, when the distance from the target 2 and the ionization space 50h is less than 10 mm, interference occurs between a plasma of the sputtering discharge on the target 2 and a plasma in the ionization space 50h, thereby making the plasmas unstable. In this embodiment, therefore, it is necessary to set the distance from the target 2 to the ionization space 50h at 10 mm or more. When the distance from the target 2 to the ionization space 50h is set at 10 mm or more and the partial pressure of a sputtering discharge gas is more than 1.3 Pa, then the sputtering particles collide against the sputtering discharge gas or sputtering gas ions multiple times between the target 2 and the ionization space 50h, whereby the result that the sputtering particles scatter. This is the reason why the partial pressure of the sputtering discharge gas within the discharge space is set in the range of not more than 1.3 Pa.

The greater part of the sputtering discharge gas ionized by sputtering discharge is accelerated by an electric field formed in the vicinity of the target 2, becomes incident upon the target 2 and sputters the target 2. Although a part of the rare gas ions reach the ionization space 50h, within the ionization mechanism 5 is disposed ionization gas introducing means 50a as will be described later and the interior of the ionization mechanism 5 is filled with helium gas (He), metastable excitation atoms of He, and He ions. Therefore, rare gas ions do not reach the interior of the ionization mechanism 5. For this reason, owing to Ar, Kr and Xe having high sputtering rates, the sputtering of a filament 50b described later does not occur and hence the consumption of the filament 50b can be prevented.

The ionization mechanism 5 is a mechanism of the hot cathode type which utilizes Penning ionization. In the ionization mechanism 5, metastable excitation atoms of He and He ions are generated by the collision of thermoelectrons emitted from the filament 50b against the He gas introduced from the rear surface of the filament 50b. And in the ionization space 50h set in the flying paths of sputtering particles from the target 2 to the substrate 8, the metastable excitation atoms of He and He ions collide against the sputtering particles and the sputtering discharge gas coming from the vicinity of the target, whereby the sputtering particles and the sputtering discharge gas are ionized.

The reason why helium gas (He) is used as the ionization gas is that because of small mass of He, the sputtering particles and the sputtering discharge gas can be ionized without scattering of both when He ions collide against the sputtering particles and the sputtering discharge gas. Furthermore, the use of He gas is aimed at preventing the consumption of the filament 50b due to the incidence of the ionization gas ion because the sputtering rate of He is low. Furthermore, the life of the metastable excitation atoms of generated He is long and an improvement in the ionization of sputtering particles is aimed at by using the metastable excitation atoms of long life.

It is necessary to install the ionization mechanism 5 in such a position that as described above, the ionization space 50h is formed in a position of 10 mm or more from the target 2. However, because it is necessary to prevent the scattering of sputtering particles between the target 2 and the ionization space 50h, the upper limit of a distance of the ionization mechanism 5 is set in consideration of the partial pressure of the sputtering discharge gas in the discharge space. That is, the distance from the surface of the target 2 to the ionization space 50h is set within twice the mean free path of the partial pressure of the sputtering discharge gas. Also this value was experimentally determined. By performing setting like this, the sputtering particles sputtered from the target 2 reach the ionization space 50h without scattering, are ionized and reach the substrate 8.

Figure 2:
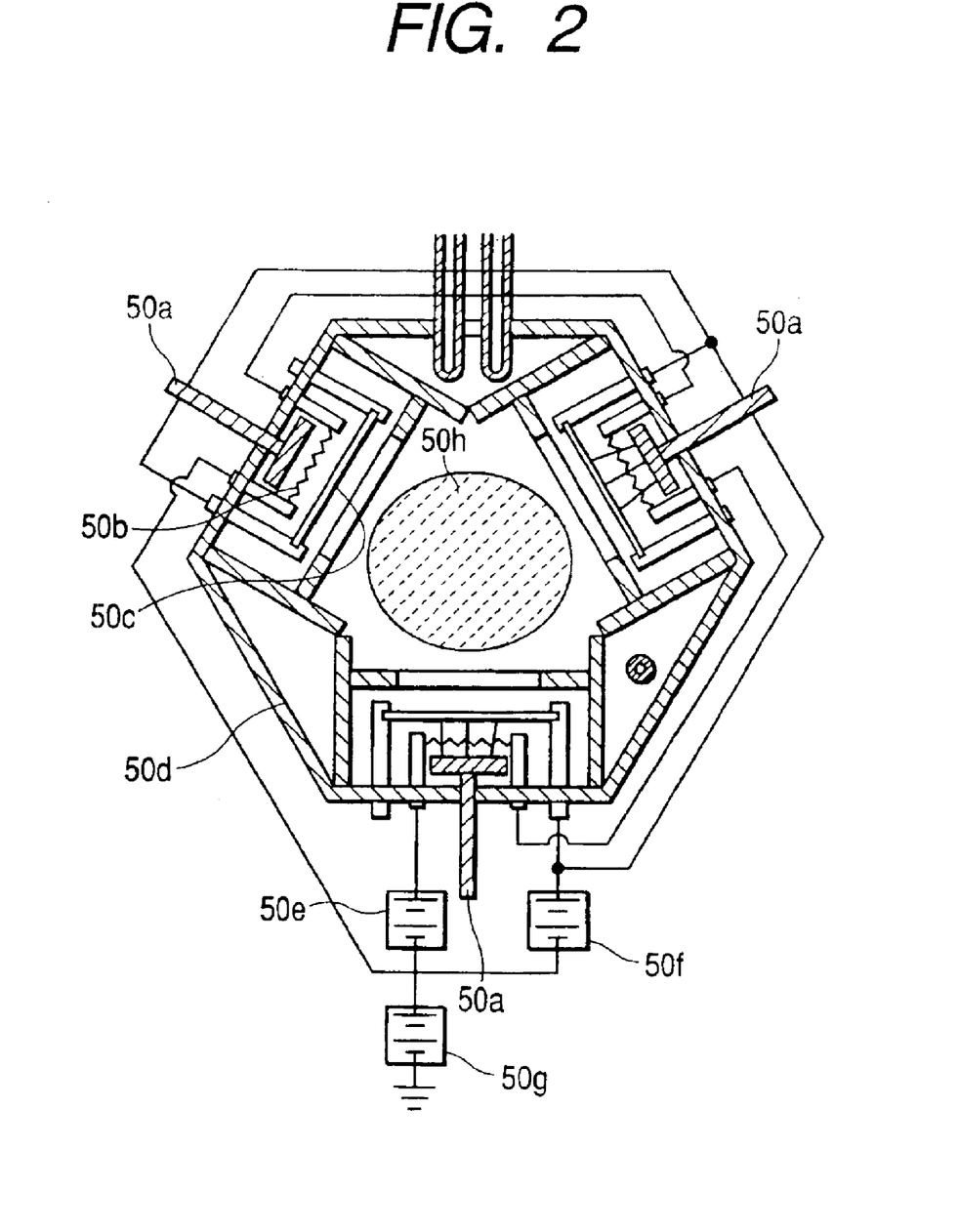
FIG. 2 is a sectional view showing the structure of an ionization mechanism.

FIG. 2 is a sectional view showing the structure of the ionization mechanism 5. FIG. 2 shows a section of the ionization mechanism taken in the line A–A' of FIG. 1. The ionization mechanism 5 causes a current to flow to the filament 50b connected in series from a DC power source 50e and causes thermoelectrons to be emitted by heating. A grid 50c has a network structure, and a positive voltage is applied by the DC power source 50f to accelerate thermoelectrons emitted from the filament 50b toward the grid 50c.

In the interior of the ionization space 5 between the filament 50b and the grid 50c and in the ionization space 50h, the accelerated thermoelectrons collide against He introduced from the rear surface of the filament 50b, whereby the metastable excitation atoms of He and He ions are generated. The generated metastable excitation atoms of He and He ions reach the ionization space 50h and collide against the sputtering particles and the sputtering discharge gas coming from the vicinity of the target, thereby ionizing the sputtering particles and the sputtering discharge gas.

Furthermore, a part of the thermoelectrons emitted from the filament 50b do not collide against He, pass through the grid 50c, and reach the ionization space 50h, thereby colliding against the sputtering particles and the sputtering discharge gas to ionize both.

Incidentally, materials having a large thermoelectron emission coefficient, such as rhenium tungsten (ReW) and tungsten (W), are adopted as the material for the filament 50b, and the grid 50c is of a network structure having a width of about 1 mm and a pitch of about 3 mm. Furthermore, the filament 50b, one side of the grid 50c and the magnetic field generating means 6 have the same electric potential as that of a casing 50d, and the casing 50d is configured so as to allow an arbitrary DC voltage to be applied from the DC power source 50g. In the method of forming a deposited film in the present embodiment, a negative DC voltage is applied. The magnetic field generating means 6 is a doughnut-shaped electromagnet having a hollow central portion and is disposed in the peripheral portion of the ionization mechanism 5. A magnetic field formed near this magnetic field generating means 6 and the magnet mechanism 3 for magnetron sputtering interfere with each other and a line of magnetic force 7 as shown in FIG. 1 is formed. The lines of magnetic force 7 extend in such a direction that these lines of magnetic force cause the sputtering particles and the sputtering discharge gas ions which are ionized within the ionization space 50h to fly in the direction of the substrate 8 by the ambipolar diffusion action without the collision and scattering of the two. A high-density plasma is generated by these lines of magnetic force 7 in the ionization space 50h.

Incidentally, the polarity of the magnetic field generating means 6 is such that the side of the target 2 is the north pole and the side of the substrate 8 is the south pole, whereas the polarity of the magnet mechanism 3 for magnetron sputtering is such that the target surface side of the target center is the north pole and the target surface side of the peripheral portion of the target is the south pole. That is, in the central portion of the target, the polarity of a magnetic field formed by the magnetic field generating means 6 and the polarity of the magnet mechanism 3 for magnetron sputtering are the same, and the above-described effect is obtained by facing the means 6 to the mechanism 3.

Incidentally, although in this embodiment an electromagnet is used in the magnetic field generating means 6, it is also possible to use a permanent magnet capable of forming a similar magnetic field. For magnetic field intensity there is a Cusp field in the vicinity of the central portion of the ionization mechanism 5 and it is desirable to set a magnetic field with a magnetic flux density of about 30 to 100 G in a direction perpendicular to the substrate surface at the central portion of a surface of the substrate 8.

Although owing to the action of the above-described ionization mechanism 5 and magnetic field generating means 6, it is possible to ionize sputtering particles efficiently in the ionization space 50$h$, in the method of forming a deposited film in this embodiment, it is necessary to raise the ionization rate of sputtering particles in order to prevent the scattering of the sputtering particles between the ionization space 50$h$ and the substrate 8. By raising the ionization rate of the sputtering particles in the ionization space 50$h$ to 80% or more, it becomes possible to make the rate of change of the composition of an alloy thin film deposited on the substrate 8 within 3% with respect to the composition of the alloy target. A substrate holder 9 can hold the substrate 8 parallel to the target 2 and is provided with a heater which heats the substrate 8 and a cooling mechanism, which are not shown.

Next, a concrete example of the method of forming a deposited film according to this embodiment will be described below.

First, the substrate 8 is set on the substrate holder 9 and the interior of the chamber 1 is exhausted to about $5 \times 10^{-5}$ Pa by use of the combined exhaust system 11. And the heater or cooling mechanism (not shown) in the substrate holder 9 is operated, although this operation differs from in process. In addition, the lines of magnetic force 7 are formed by operating the magnetic field generating means 6 and, at the same time, the ionization mechanism 5 is operated. That is, there is a Cusp field in the vicinity of the central portion of the ionization mechanism 5 and a magnetic field with a magnetic flux density of about 30 to 100 G in a direction perpendicular to the substrate surface is set in the central portion of the substrate surface. At the same time, a DC power source 50$g$ for floating is driven to set the DC voltage value at an arbitrary value, and the filament 50$b$ is heated by driving a power source 50$e$ for filament to thereby cause thermoelectrons to be emitted into the ionization space 50$h$.

Further, He gas is introduced by use of the ionization gas introducing means 50$a$, a sputtering discharge gas such as argon gas is introduced by use of the sputtering discharge gas introducing means 12, and pressure adjustment is made by controlling an exhaust speed regulator of the combined exhaust system 11 so that the partial pressure of the sputtering discharge gas in the discharge space becomes 1.3 Pa or less. And a sputtering discharge is generated by driving the sputtering power source 4 and sputtering is started. After pre-sputtering is carried out for several minutes, a substrate shutter 10 is opened and film formation is started.

Particles sputtered by the sputtering discharge are ionized in the ionization space 50$h$, fly toward the substrate 8 and are deposited. After a film having a predetermined thickness is formed, the substrate shutter 10 is closed, the driving of the sputtering power source 4 and the gas introducing means 50$a$ and 12 is stopped, and the driving of the filament power source 50$e$, grid power source 50$f$ and floating power source 50$g$ of the ionization mechanism 5 and the electromagnet power source 60$a$ is stopped.

Lastly, the gate valve (not shown) is closed to perform leakage from the chamber 1 and the substrate 8 is taken out of the substrate holder 9.

The effects of the present invention will be concretely described below by means of the following examples. Incidentally, the present invention is not limited by these examples.

EXAMPLE 1

First, Example 1 of the present invention will be described. In this example, ionized sputtering was performed by changing the partial pressure of the sputtering discharge gas in the discharge space under the following conditions according to the above-described embodiments, and an alloy thin film having a film thickness of 1.0 $\mu$m was deposited on the substrate 8 to make samples. The compositions of all these samples were analyzed by performing an EPMA (electron probe micro-analysis) and compared with the composition of the alloy target.

Material of target 2: TbFe
Size of target 2: $\phi$ 76.2×t 3 mm
Input power to target 2: 400 W
Distance between target 2 and substrate 8: 100 mm
Distance between target 2 and ionization space 50$h$: 10 mm
Material of substrate 8: Non-alkali glass
Size of substrate 8: $\phi$ 2" (50.8 mm)
Kind of sputtering discharge gas: Argon
Magnetic field intensity in central portion of substrate surface of substrate 8: 50 G
Kind of ionization gas: Helium
Grid voltage of ionization mechanism 5: 50 V
Grid current of ionization mechanism 5: 20 A
Floating power source voltage of ionization mechanism 5: −40 V Table 1 shows the result of this example. As shown in Table 1, by setting the partial pressure of the sputtering discharge gas in the discharge space at 1.3 Pa or less, the composition of an alloy thin film deposited on the substrate 8 becomes almost the same as the composition of the alloy target (rate of change: within 3%).

TABLE 1

| | | Deposited film Pressure (Pa) | | | | | |
|---|---|---|---|---|---|---|---|
| | Target | 0.33 | 0.66 | 1.00 | 1.30 | 1.40 | 1.60 |
| Tb composition (at. %) | 60.0 | 60.2 | 60.3 | 60.5 | 60.9 | 61.5 | 62.0 |
| Fe composition (at. %) | 40.0 | 39.8 | 39.7 | 39.5 | 39.1 | 38.5 | 38.0 |

EXAMPLE 2

Under the conditions of Example 1, two partial pressures of sputtering discharge gas of 0.66 Pa and 0.33 Pa in the discharge space were used, and under the respective partial pressure conditions ionized sputtering was performed by changing the distance between the target 2 and the ionization space 50$h$, i.e., the installation position of the ionization mechanism 5. An alloy thin film having a film thickness of 1.0 $\mu$m was deposited on the substrate 8 to make samples. The compositions of all these samples were analyzed by performing an EPMA (electron probe micro-analysis) and compared with the composition of the target.

Tables 2 and 3 show the results of this example. Table 2 shows the result obtained when the partial pressure of the sputtering discharge gas was 0.33 Pa, and Table 3 shows the result obtained when the partial pressure of the sputtering discharge gas was 0.66 Pa.

TABLE 2

Pressure: 0.33 Pa

| | | Deposited film Distance between target and ionization space (mm) | | | | | |
|---|---|---|---|---|---|---|---|
| | Target | 10 | 20 | 30 | 40 | 50 | 60 |
| Tb composition (at. %) | 60.0 | 60.2 | 60.2 | 60.4 | 60.9 | 61.6 | 62.3 |
| Fe composition (at. %) | 40.0 | 39.8 | 39.8 | 39.6 | 39.1 | 38.4 | 37.7 |

Distance twice the mean-free path: 40 mm

TABLE 3

Pressure: 0.66 Pa

| | | Distance between target and ionization space (mm) | | | | |
|---|---|---|---|---|---|---|
| | Target | 10 | 15 | 20 | 25 | 30 |
| Tb composition (at. %) | 60.0 | 60.2 | 60.3 | 60.9 | 61.5 | 62.4 |
| Fe composition (at. %) | 40.0 | 39.8 | 39.7 | 39.1 | 38.5 | 37.6 |

Distance twice the mean-free path: 20 mm

As is apparent from Tables 2 and 3, by setting the distance between the target 2 and the ionization space 50h within twice the mean free path of the partial pressure of the sputtering discharge gas, it becomes possible to make the composition of an alloy thin film deposited on the substrate 8 almost the same as the composition of the alloy target (rate of change: within 3%).

EXAMPLE 3

Under the conditions of Example 1, a target of GdFe and a partial pressure of sputtering discharge gas of 1.3 Pa in the discharge space were used, and ionized sputtering was performed by changing the ionization rate of sputtering particles through the adjustment of the quantity of thermoelectrons emitted from the filament in the ionization mechanism 5. An alloy thin film having a film thickness of 1.0 μm was deposited on the substrate 8 to make samples. The compositions of all these samples were analyzed by performing an EPMA (electron probe micro-analysis) and compared with the composition of the alloy target. Incidentally, the ionization rate of the sputtering particles was calculated from the quantity of the current of the ionized sputtering particles which become incident upon an energy filter disposed in the position of the substrate 8 and the value of film forming rate of an alloy thin film deposited on the substrate 8.

Table 4 shows the result of this example.

TABLE 4

| | | Deposited film Ionization rate (%) | | | | |
|---|---|---|---|---|---|---|
| | Target | 60 | 70 | 30 | 85 | 90 |
| Gd composition (at. %) | 60.0 | 62.3 | 62.0 | 60.9 | 60.9 | 60.8 |
| Fe composition (at. %) | 40.0 | 37.7 | 38.0 | 39.1 | 39.1 | 39.2 |

As is apparent from Table 4, by setting the ionization rate of the sputtering particles at 80% or more, it is possible to ensure the rate of change of the composition of an alloy thin film deposited on the substrate 8 within 3% with respect to the composition of the alloy target.

EXAMPLE 4

Under the conditions of Example 1, a partial pressure of sputtering discharge gas of 0.66 Pa in the discharge space was used. Ionized sputtering was performed with the same conditions kept from immediately after a change of the target (immediately after the start of use) until the target was completely consumed, and an alloy thin film having a film thickness of 1.0 μm was deposited at fixed intervals on the substrate 8 to make samples. The compositions of all these samples were analyzed by performing an EPMA (electron probe micro-analysis) and compared with the composition of the alloy target.

Figure 3:
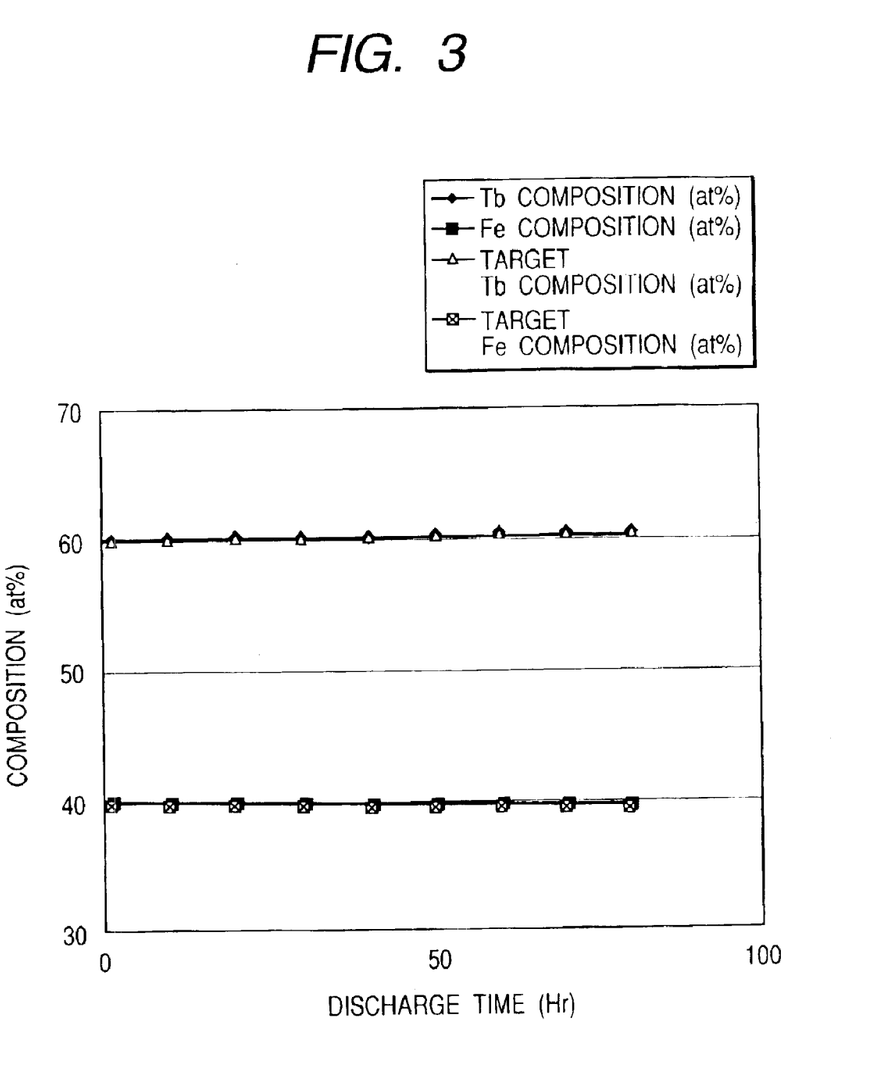
FIG. 3 is a graph showing the change of the composition percentage of the deposited alloy film compared with the composition percentage of the alloy target as plotted at fixed intervals of discharge time in Example 4 of the present invention.

Table 5 and the graph shown in FIG. 3 show the results of this example. FIG. 3 shows a graph showing the change of the composition percentage of the deposited alloy film with respect to the composition percentage of the alloy target as plotted at fixed intervals of discharge time.

TABLE 5

| | Deposited film | |
|---|---|---|
| Discharge time (Hr) | Tb composition (at. %) | Fe composition (at. %) |
| 1 | 60.2 | 39.8 |
| 10 | 60.2 | 39.8 |
| 20 | 60.2 | 39.8 |
| 30 | 60.3 | 39.7 |
| 40 | 60.3 | 39.7 |
| 50 | 60.3 | 39.7 |
| 60 | 60.4 | 39.6 |
| 70 | 60.4 | 39.6 |
| 80 | 60.4 | 39.6 |

Target composition
Tb: 60 (at. %)
Fe: 40 (at. %)

As is apparent from FIG. 3, the composition of an alloy thin film deposited on the substrate 8 was almost the same as the composition of the alloy target (rate of change: within 3%) from immediately after starting the use of the target until the completion of the use.

As described above, in the method of forming a deposited film according to the present invention, it becomes possible to form an alloy thin film of the same composition as the composition of the alloy target (rate of change of composition: within 3%) without changing the film forming conditions from the start of use of the target until the target is completely consumed. The method of forming a deposited film according to the present invention does not require setting conditions for adjustment of the composition of an alloy thin film and is suitable for mass production.

What is claimed is:

1. A deposited-film forming method of forming a thin film composed of an alloy by sputtering by use of an alloy target, comprising:

a first step of performing Penning ionization of sputtering particles sputtered from the alloy target; and a second step of causing the ionized sputtering particles to fly in a direction of the substrate by ambipolar diffusion action due to a magnetic field formed from an ionization space to the substrate.

2. The method according to claim 1, wherein helium gas is introduced as a ionization gas into an interior of an ionization mechanism.

3. The method according to claim 1, wherein a rare gas is introduced as a sputtering discharge gas into a vicinity of the alloy target so that a partial pressure of the rare gas in a discharge space becomes within a predetermined range.

4. The method according to claim to claim 3, wherein the predetermined range is 1.3 Pa or less.

5. The method according to claim 1, wherein a distance from a surface of the alloy target to the ionization space is set within twice a mean-free path of a partial pressure of a sputtering discharge rare gas.

6. The method according to claim 1, wherein an ionization rate of the sputtering particles is 80% or more.

7. A deposited-film forming apparatus for forming a thin film composed of an alloy on a substrate by sputtering by use of an alloy target, comprising:

an ionization mechanism for performing Penning ionization of sputtering particles sputtered from the alloy target; and a magnetic field generating mechanism for generating a magnetic field for causing the ionized sputtering particles to fly in a direction of the substrate by ambipolar diffusion action.

* * * * *

UNITED STATES PATENT AND TRADEMARK OFFICE
CERTIFICATE OF CORRECTION

PATENT NO. : 6,878,241 B2
DATED : April 12, 2005
INVENTOR(S) : Yamaguchi et al.

It is certified that error appears in the above-identified patent and that said Letters Patent is hereby corrected as shown below:

Column 2,
Line 7, "its" (both occurrences) should read -- their --; and
Line 23, "in" should be deleted.

Column 6,
Line 27, "do" should be -- does --.

Column 10,
Table 4, "30" should read -- 80 --.

Signed and Sealed this

Thirteenth Day of September, 2005

JON W. DUDAS
*Director of the United States Patent and Trademark Office*